United States Patent
Kardontchik

(10) Patent No.: US 7,061,319 B1
(45) Date of Patent: Jun. 13, 2006

(54) APPARATUS AND METHOD FOR A LOW-VOLTAGE SUPPLY LOW-POWER VARIABLE GAIN AMPLIFIER

(75) Inventor: Jaime E. Kardontchik, Sunnyvale, CA (US)

(73) Assignee: Integration Associates, Inc., Mountain View, CA (US)

( * ) Notice: Subject to any disclaimer, the term of this patent is extended or adjusted under 35 U.S.C. 154(b) by 46 days.

(21) Appl. No.: 10/851,427

(22) Filed: May 21, 2004

Related U.S. Application Data

(60) Provisional application No. 60/472,264, filed on May 21, 2003.

(51) Int. Cl.
*H03F 3/45* (2006.01)

(52) U.S. Cl. ...................................... 330/254; 330/278
(58) Field of Classification Search ................ 330/252, 330/253, 254, 278
See application file for complete search history.

(56) References Cited

U.S. PATENT DOCUMENTS 6,566,951 B1 * 5/2003 Merrigan et al. ........... 330/254

* cited by examiner

*Primary Examiner*—Khanh Van Nguyen
(74) *Attorney, Agent, or Firm*—Vernon W. Francissen; Francissen Patent Law, P.C.

(57) ABSTRACT

A low-voltage supply low-power variable gain amplifier is shown that includes an input control circuit for receiving input signals, a variable gain amplifier (VGA) coupled to the input control circuit, and a circuit output terminal. A differential transconductor is interposed between the input control circuit and the VGA. The VGA amplification of the differential transconductor output is controlled by a gain control voltage signal. A differential amplifier is interposed between the input control circuit and the differential transconductor, where the differential amplifier receives and amplifies the input signal to produce an amplified input signal. An output filter is interposed between the VGA and the circuit output terminal.

15 Claims, 6 Drawing Sheets

APPARATUS AND METHOD FOR A LOW-VOLTAGE SUPPLY LOW-POWER VARIABLE GAIN AMPLIFIER

CROSS-REFERENCE TO RELATED PATENT APPLICATIONS

This patent application is based upon provisional U.S. Patent Application No. 60/472,264 filed May 21, 2003.

BACKGROUND OF THE INVENTION

1. Field of Invention

The present invention relates to a variable gain amplifier circuit.

2. Description of the Related Art

The Variable Gain Amplifier (VGA) is a critical baseband block of modern data communication transceivers. A VGA architecture was first proposed in the 1960s.

A representative example of a conventional VGA is shown in FIG. 1. The VGA 10 includes an input differential pair gain stage composed of transistors of 24 and 34 and resistors 40 and 42. It is biased by transistor 38. The amplification stage of the VGA of is comprised of two differential pairs. The first of these pairs consists of resistor 26 and transistors 20 and 22. Resistor 36 and transistors 30 and 32 form the second pair. The VGA additionally includes resistors 12 and 14 to reduce the current flowing through the differential pairs of the amplification stage. In operation, a differential input signal is applied across the differential input pair by connecting the positive input to the base of transistor 24 and the negative input to the base of transistor 34. Applying a differential signal across both differential pairs that comprise the amplification stage controls the variable gain of the VGA. The positive control signal is applied to the base of transistor 22 and transistor 30. The negative control signal is applied to the base of transistor 20 and transistor 32.

The conventional VGA architecture has been kept practically unchanged since its inception until today. It is compact and has both low noise and high input-to-output linearity. Its gain versus control voltage transfer function characteristics are linear when the gain is expressed in decibel units, which makes this VGA the preferred selection in high performance Automatic Gain Control (AGC) systems. It is the de-facto standard against which new VGA architectures are typically compared.

However, this architecture has some limitations and weaknesses. First, it has three stacked bipolar transistors and two resistors between the power supply and ground. Hence, it cannot be used with voltage supplies below ~3 volts DC. Second, in order to obtain high linearity from input-to-output, the input differential pair stage transistors, transistors 24 and 34 as shown in FIG. 1, must be operating linearly. Thus, the current through the input differential pair stage transistors must be large. However, in order to minimize the noise of the circuit, only a small current should flow through the amplification stage containing transistors 20, 22, 30, and 32. These conflicting requirements have forced the addition of resistors 12 and 14 to the basic architecture in order to divert a significant part of the current away from the quad transistors 20, 22, 30, and 32. In other words, the addition of resistors 12 and 14 to the circuit introduces inefficiency because a significant amount of power is simply dissipated by resistors 12 and R8 14 serving no useful purpose other than reducing the current through the actual elements that implement the VGA functionality (e.g. transistors 20, 22, 30, and 32 and resistors 26 and 36).

For many years these limitations were considered irrelevant. The requirement that the minimum voltage supply be greater than approximately 3 volts DC was almost a non-issue because existing voltage supplies were commonly in the range of 5 to 12 volts DC. Further, the increased power consumption was also negligible because most circuits were ultimately connected to a line supply of current: e.g. a 110/220 volts AC power supply.

However, with the development of portable, battery-operated wireless transceivers (particularly remote wireless sensor networks), limitations on voltage supplies and power consumption are increasingly important. Specifically, the voltage supply has to be as low as possible and the current consumption has to be kept to a minimum in order to prolong the useful lifetime of battery-operated transceivers from a few hours to months or even years.

Since some emerging applications require increased efficiency that cannot be obtained by simply optimizing the conventional VGA, there is a need for new VGA architectures that can meet the requirements of such emerging applications. Accordingly, it is advantageous to use a VGA that provides increased efficiency by consuming minimal current and functioning with a low voltage supply.

SUMMARY OF THE INVENTION

The present invention relates to an apparatus and method for variably amplifying a signal.

An embodiment of low-voltage supply low-power variable gain amplifier circuit, according to the present invention, includes a first amplifier having an input and an output and a transconductor having an input and an output. The circuit further includes a variable gain amplifier having an input coupled to the output of the transconductor, an output and a variable gain control input. The variable gain amplifier is configured such that a gain of the variable gain amplifier is controlled by a signal received at the variable gain control input. The circuit also includes an input control circuit having a first input for receiving a signal to be amplified, a second input electrically coupled to the output of the first amplifier, a first output coupled to the input of the first amplifier, a second output coupled to the input of the transconductor, and a gain control input. The input control circuit is configured to electrically couple the input and first output terminals of the input control circuit responsive to a first signal received at the gain control input corresponding to a high gain mode. The input control circuit is further configured to electrically couple the input and second output terminals of the input control circuit responsive to a second signal received at the gain control input corresponding to a low gain mode. In a further refinement of this embodiment, the input control circuit is further configured to generate a disabling signal at the first output of the input control circuit responsive to the second signal received at the gain control input corresponding to a low gain mode and the first amplifier is further configured to reduce its power supply current draw responsive to the disabling signal output by the input control circuit.

An embodiment of a method for selectively providing high gain amplification and low gain amplification to a received signal, according to the present invention, calls for providing an amplification stage for amplifying the received signal, providing a transconductance stage for transconducting the received signal, and providing a variable gain stage for amplifying the output of the transconductance stage under control of a variable gain control signal. The method also sets forth selectively engaging the amplification stage to amplify the received signal and output the amplified received signal to the transconductance stage responsive to a control signal corresponding to a high gain mode. The method further calls for selectively routing the received signal to the transconductance stage responsive to a control signal corresponding to a low gain mode. In a further refinement of this embodiment, the step of selectively routing the received signal to the transconductance stage responsive to a control signal corresponding to a low gain mode further includes disabling the amplifier stage in the low gain mode.

The features and advantages of the present invention will become more readily apparent from the following detailed description of a preferred embodiment of the invention which proceeds with reference to the accompanying drawings.

DETAILED DESCRIPTION OF THE PRESENT INVENTION

Because of the inherent inefficiencies of the conventional VGA architecture, it is desirable to create an improved VGA that is capable of operating with a low-voltage supply and consumes power at a low rate.

Figure 2A:
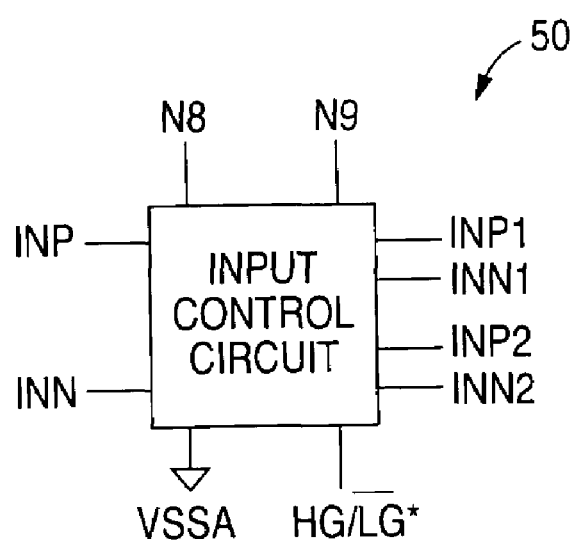
FIG. 2 is a functional block diagram illustrating one embodiment of a variable gain amplifier in accordance with the present invention.
Figure 2B:
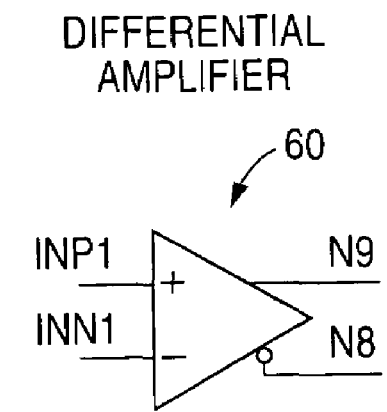
Figure 2C:
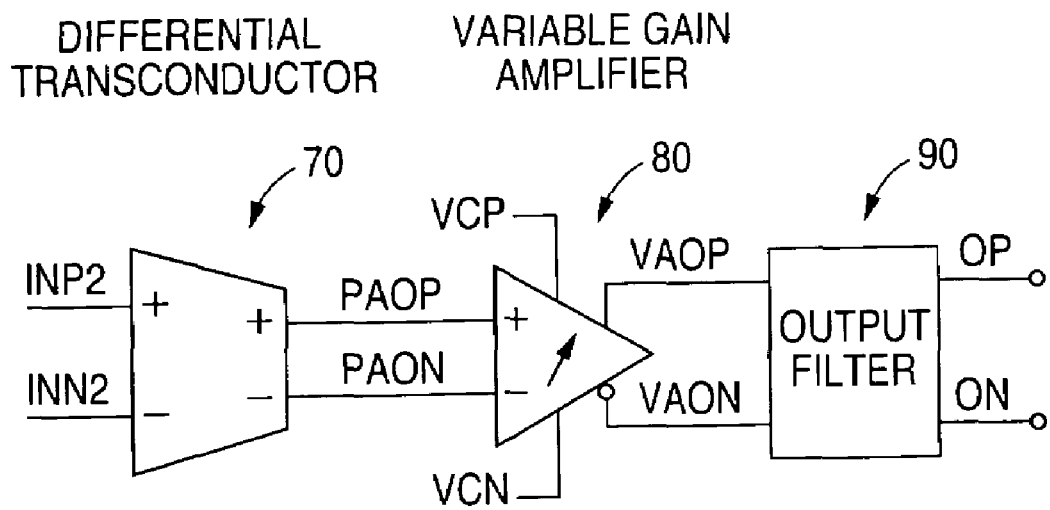

FIG. 2 is a functional block diagram illustrating an embodiment of a variable gain circuit, according to the present invention, that is generally applicable to low intermediate frequency (IF) receiver architectures. An input control circuit 50 is connected to both a differential amplifier stage 60 and a differential transconductor stage 70 and permits the variable gain circuit to be switched between a high-gain level and a low-gain level under control of a high-gain/low-gain control signal HG/LG*. As in the standard architecture, a differential input signal is applied to a set of input terminals labeled INP and INN. The input control circuit 50 receives a differential input signal at the input terminals labeled INP and INN. In addition, the HG/LG* control input signal is also received at the input labeled HG/LG in FIG. 2. The differential amplifier 60 has a differential input that is connected to the input control circuit 50 at an output pair labeled INP1 and INN1. The input control circuit 50 also receives the output nodes N8 and N9 of differential amplifier 60.

Under control of the HG/LG* control input signal, input control circuit 50 determines whether the signal received at input nodes INP and INN is directed through differential amplifier 60 before being input to differential transconductor 70 (high-gain mode) or whether the received signal is directed straight to differential transconductor 70 (low-gain mode).

The differential transconductor 70 is disposed between a variable gain amplifier (VGA) stage 80 and the input control circuit 50. It has a differential input that is connected to the input control circuit 50 at an output pair labeled INP2 and INN2. The differential transconductor 70 also has a differential output signal. This differential output signal is referred to as the pre-amplifier output (PAO) and the differential signals at the output terminals of transconductor 70 are PAOP and PAON. The VGA 80 is connected to the differential transconductor 70. The VGA has a differential input, to which PAOP and PAON, the differential output signal from the differential transconductor 70, are applied. The amplification provided by the VGA 80 is controlled by a differential control signal VCP and VCN, which is typically controlled by an AGC circuit that is not also controlling the differential signal applied to the input control circuit 50. An output filter 90 is coupled with a differential output from VGA 80. The voltage amplifier output from VGA 80 is differential signals VAOP and VAON. A set of input terminals on the output filter 90 are connected to the output terminals on the VGA 80 so that the inputs to the output filter 90 are VAOP and VAON.

Figure 3:
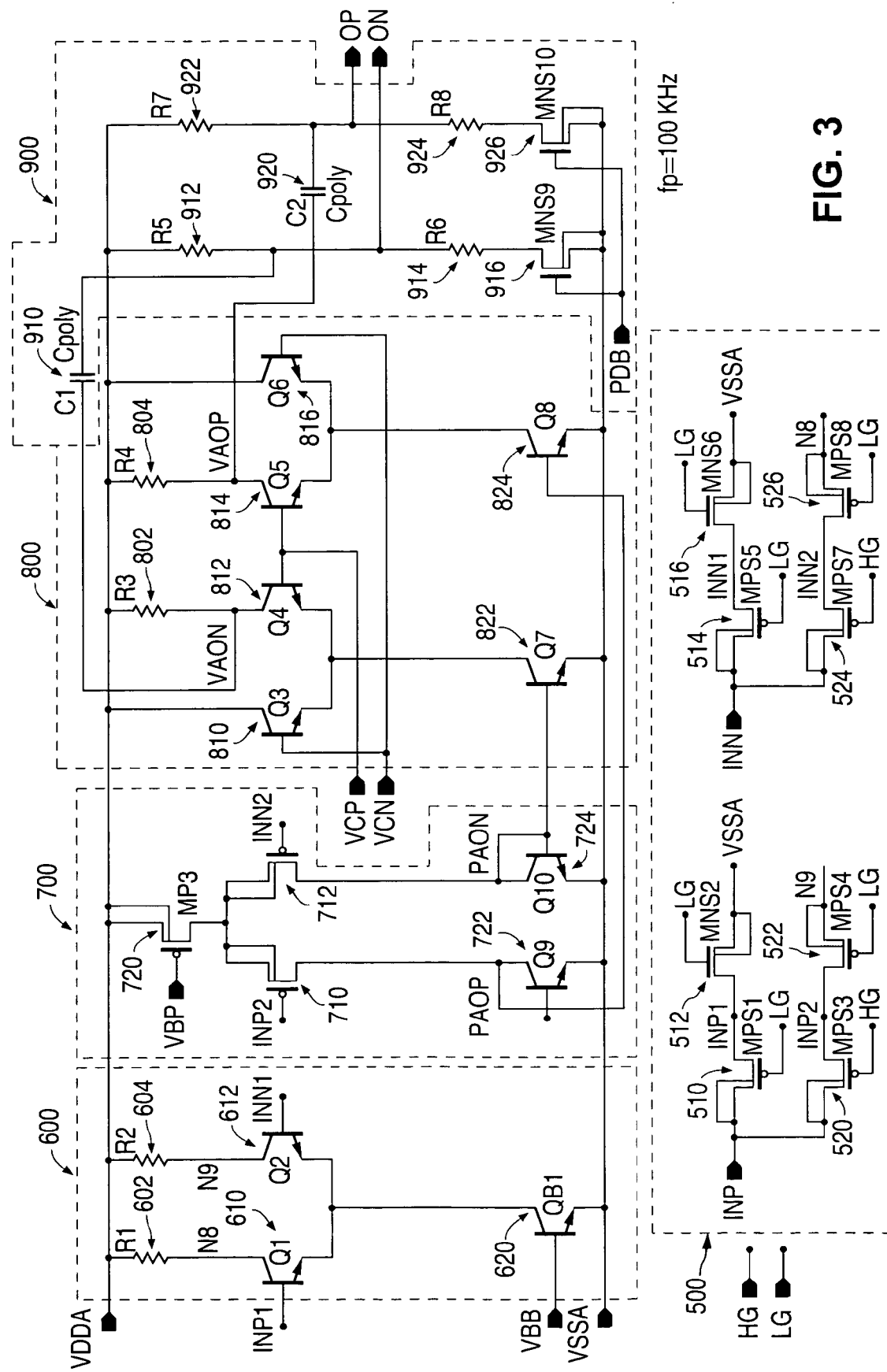
FIG. 3 is a circuit diagram illustrating an embodiment of a low-voltage supply low-power variable gain amplifier according to the present invention.

The functional blocks illustrated in FIG. 2 can be implemented in a variety of ways, as one of ordinary skill in the art would recognize. One exemplary embodiment of a transistor circuit implementation of the functional blocks of FIG. 2 is illustrated in FIG. 3. Input control circuit 500 of FIG. 3 shows one embodiment of the input control circuit 50 of FIG. 2. One way to implement the differential amplifier 60 in FIG. 2 is depicted in the differential amplifier circuit 600 of FIG. 3. The differential transconductor 70 of FIG. 2 can be implemented as shown in the differential transconductor circuit 700 of FIG. 3. Implementation of the VGA 80 of FIG. 2 can be accomplished by use of the VGA circuit 800 depicted in FIG. 3. Finally, the output filter 90 in FIG. 2 may be realized as the output filter circuit 900 of FIG. 3.

In the embodiment of an input control circuit 500 shown in FIG. 3, the input control circuit 500 is composed of four pairs of metal-oxide semiconductor (MOS) transistors. A first pair of MOS transistors, PMOS transistor 510 and NMOS transistor 512, controls whether input terminal INP is electrically coupled to input INP1 of differential amplifier 60 under control of low gain signal LG. Similarly, a second pair of MOS transistors, PMOS transistor 514 and NMOS transistor 516, controls whether input terminal INN is electrically coupled to input INN1 of differential amplifier 60 under control of low gain signal LG. When control signal LG is low, then INP and INN are electrically coupled to the inputs INP1 and INN 1, respectively, of differential amplifier 600, which then provides preamplification of the signal received at INP and INN. Conversely, when control signal LG is high, e.g. low-gain mode, then INP and INN are electrically isolated from INP1 and INN1 and a low supply rail voltage VSSA is applied to INP1 and INN1, which turns differential amplifier 600 off by halting the flow of current through transistors 610 and 612. Transistor 620 provides the bias current for amplifier 600 under control of a bias voltage VBB.

Another pair of MOS transistors, PMOS transistors 520 and 522, control whether input INP2 of differential transconductor 700 is electrically coupled to input terminal INP or output node N9 of amplifier 600 under the control of signal HG and LG. Similarly, PMOS transistors 524 and 526, control whether input INN2 of differential transconductor 700 is electrically coupled to input terminal INN or output node N8 of amplifier 600 also under the control of signal HG and LG. When control signal HG is high and control signal LG is low, e.g. high gain mode, then output nodes N9 and N8 from amplifier 600 are electrically coupled to inputs INP2 and INN2, respectively, of transconductor 700. Conversely, when control signal HG is low and control signal LG is high, e.g. low gain mode, then output nodes N9 and N8 from amplifier 600 are electrically isolated from transconductor 700 and input terminals INP and INN are electrically coupled to the inputs INP2 and INN2, respectively, of transconductor 700.

Thus, in high gain mode, differential amplifier 600 is electrically inserted into the circuit between input terminals INP and INN and transconductor 700 to provide pre-amplification. In low gain mode, differential amplifier 600 is electrically removed from the circuit, and disabled such that no pre-amplification is performed, and the signal received at input terminals INP and INN is diverted directly to the inputs INP2 and INN2 of transconductor 700.

To further describe the differential amplifier circuit 600 depicted in FIG. 3, a differential input pair of bipolar transistors 610 and 612, are connected at their emitters to a biasing transistor 620. The bases of both transistors 610 and 612 are connected to the input control circuit 500. The collector of transistor 610 is connected to resistor 602, which is also connected to high side supply rail VDDA to provide supply current. Similarly, the collector of 612 is connected to resistor 604, which is also connected to high side supply rail VDDA. In addition, the collector of 610 is connected to node N8, which is one differential output of amplifier 600, and the collector of 612 is connected to node N9, which is the other differential output of amplifier 600. Differential outputs N8 and N9 are further connected to the input control circuit 500.

FIG. 3 also illustrates one implementation of a differential transconductor circuit 700. The circuit 700 includes a pair of PMOS transistors 710 and 712, whose gates are the inputs INP2 and INN2, respectively, of transconductor 700. The gates of both transistors 710 and 712 are connected to the input control circuit 500. The sources of transistors 710 and 712 are connected to the drain of a biasing PMOS transistor 720 that is controlled by a PMOS biasing voltage VBP. The source of transistor 720 is connected to high side supply rail VDDA to provide supply current. Transconductor 700 further includes bipolar transistors 722 and 724, which are separately coupled in series with transistors 710 and 712, respectively. Transistor 722 is coupled in series with transistor 710 and is diode connected to form a current mirror that is one differential output PAOP of transconductor 700.

Transistor 722 is coupled to a base of transistor 824 of variable gain amplifier 800. Likewise, transistor 724 is coupled in series with transistor 712 and is diode connected to form a current mirror that is the other differential output PAON of transconductor 700. Transistor 724 is coupled to a base of transistor 822 of VGA 800. Thus, transistors 722 and 724 output the transconducted signal by mirroring their current to transistors 824 and 822, respectively, of VGA circuit 800.

The embodiment of the VGA circuit 800 illustrated in FIG. 3 includes the two bipolar transistors 822 and 824 that receive the differential output current signal from transconductor 700. The VGA circuit 800 also includes two differential pairs of transistors: a first differential pair having bipolar transistors 810 and 812 and a second differential pair having bipolar transistors 814 and 816. Transistor 822 is coupled in series with the first differential pair and transistor 824 is coupled is series with the second differential pair. The emitters of transistors 810 and 812 are connected to the collector of transistor 822. The collector of transistor 810 is connected to high side supply rail VDDA whereas resistor 802 is connected between the collector of transistor 812 and VDDA, such that the collector of transistor 812 becomes one of the differential outputs VAON of VGA 800. Thus, the differential output current from PAON of transconductor 700 is reflected through transistor 822 and into differential pair 810 and 812 for variable amplification and output to output filter 900 and output terminal ON.

Similarly, the emitters of transistors 814 and 816 are connected to the collector of transistor 824. The collector of transistor 816 is connected to VDDA whereas resistor 804 is connected between the collector of transistor 814 and VDDA, such that the collector of transistor 814 becomes the other differential output VAOP of VGA 800. Thus, the differential output current from PAOP of transconductor 700 is reflected through transistor 824 and into differential pair 814 and 816 for variable amplification and output to output filter 900 and output terminal OP. The variable amplification of VGA 800 is controlled by differential variable gain control signals VCP and VCN, which differentially drive the differential pairs. The signal VCP drives the base terminals of transistors 812 and 814, while signal VCN drives the bases of transistors 810 and 816.

Figure 1:
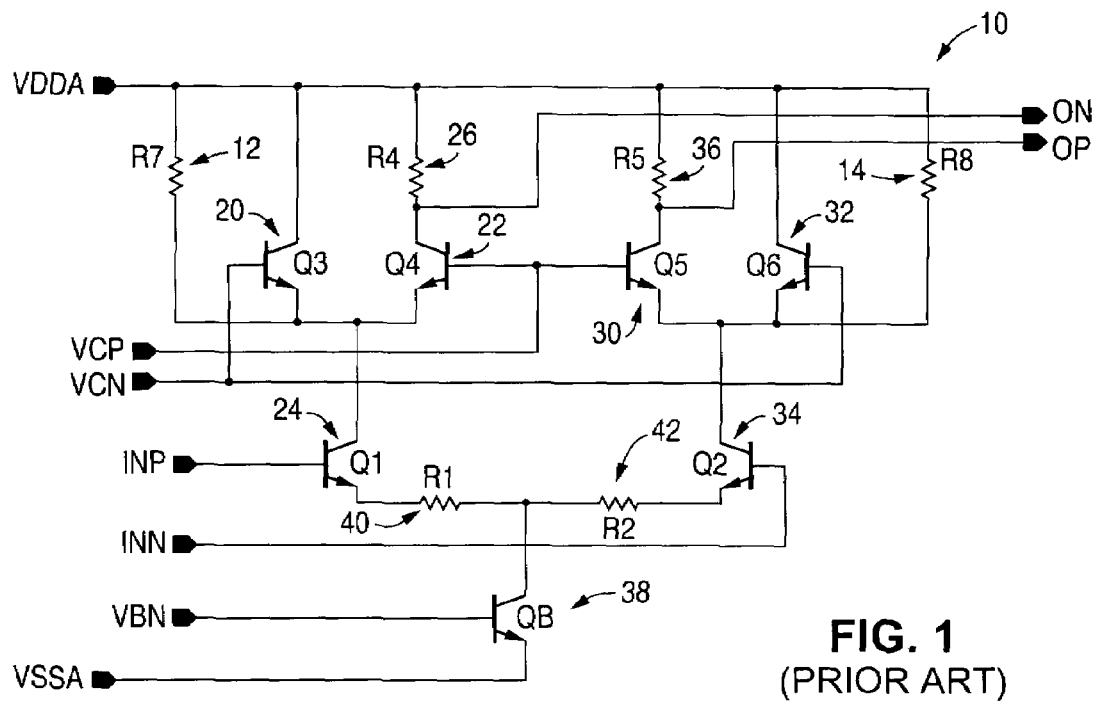
FIG. 1 is a circuit diagram of a conventional variable gain amplifier.

Separate stages are used for the differential input signal (INP–INN) and the automatic gain control (AGC) control signal. This eliminates the need to stack three bipolar transistors and two resistors between the high side voltage supply rail VDDA and low side voltage supply rail VSSA. As a result, the 3-volt DC supply voltage limitation is eliminated. Furthermore, since the current through the transistor quad (810, 812, 814, 816) in VGA 800 can be optimized independently from the current into the differential input pair (610 and 612) in the differential amplifier circuit 600, there is no need to waste part of the current into resistors such as resistors 12 and 14 shown in FIG. 1.

In the embodiment of the input control circuit 500 shown in FIG. 3, MOS transistors are used as switches to control a differential input signal applied to sets of input terminals on the differential amplifier circuit 600 and on the differential transconductor circuit 700. The differential input signal has a positive side INP and a negative side INN. PMOS transistor 510 and NMOS transistor 512 are connected in series between INP and VSSA. PMOS transistors 520 and 522 are connected in series between INP and N9 on the collector of transistor 612 in the differential amplifier circuit 600. PMOS transistor 514 and NMOS transistor 516 are connected in series between INN and VSSA. PMOS transistors 524 and 526 are connected in series between INN and N8 on the collector of transistor 610 in the differential amplifier circuit 600.

The switches are controlled by a signal that indicates whether the circuit should operate in high-gain or low-gain mode. The differential amplifier circuit 600 has an input INP1 that is connected to the drains of transistors 510 and 512. When the input control circuit 500 is operating in low-gain mode transistor 510 allows a signal INP1 at the base of transistor 610 in the differential amplifier circuit 600 to equal the input signal INP. On the other hand, if the input control circuit 500 is operating in high-gain mode, transistor 512 will set INP1 equal to VSSA. The differential transconductor circuit 700 has an input INP2 at the gate of transistor 710. When operating in low-gain mode, transistor 520 of the input control circuit 500 will set INP2 to INP. However, when in the high-gain mode, the transistor 522 will set INP2 equal to the voltage on N9 of the differential amplifier circuit 600. The differential amplifier circuit 600 has an input INN1 that is connected to the drains of transistors 514 and 516. When the input control circuit 500 is operating in low-gain mode, transistor 516 allows a signal INN1 at the base of transistor 612 in the differential amplifier circuit 600 to equal VSSA. On the other hand, if the input control circuit 500 is operating in high-gain mode, transistor 514 will set INN1 equal to the input signal INN.

The differential transconductor circuit 700 has an input INP2 that is connected to the drains of transistors 520 and 522. When the input control circuit 500 is operating in low-gain mode, transistor 510 passes the input signal INP directly to the input INP2 at the gate of transistor 710. When the input control circuit 500 is operating in high-gain mode, transistor 522 is on and connects INP2 to N9 on the differential amplifier 600. The differential transconductor circuit 700 also has an input INN2 that is connected to the drains of transistors 524 and 526. When the input control circuit 500 is operating in low-gain mode, transistor 524 is on and INN2 is equal to the input signal INN. On the other hand, when the input circuit 500 is operating in high-gain mode, transistor 526 links INN2 to N8 on the differential amplifier 600.

Due to the input control circuit 500, the VGA includes a dual-gain architecture. Weak input signals pass through both the differential amplifier circuit 600 and the differential transconductor circuit 700. Strong input signals, however, are connected directly to the differential transconductor circuit 700 and bypass the differential amplifier circuit 600. For weak input signals, the first two stages of the VGA 800, which includes a bipolar differential amplifier circuit 600 and a metal-oxide semiconductor (MOS) differential transconductor 700, are connected in series by setting the digital control voltages to the MOS transistor switches (510, 512, 520, 522, 514, 516, 514, and 526) in the input control circuit 500 to HG='1' and LG='0'. In this mode of operation, a high-gain (about 45 dB gain for the example shown later) and a low-noise (~6 uVrms input referred noise, see example shown later) are obtained, which are the most important parameters for weak signals, and the linearity is fairly good (IIP3 of about −20 dBm). On the other hand, for strong input signals, the bipolar differential amplifier circuit 600 is bypassed by setting the control voltages to the MOS switches (510, 512, 520, 522, 514, 516, 514, and 526) in the input control circuit 500 to HG='0' and LG='1'. The input is thus connected directly to the MOS differential transconductor circuit 700. Although, the maximum attainable gain is smaller (~20 dB), the linearity of the MOS differential transconductor circuit 700 is much better than the linearity of the bipolar differential pair (610 and 612) in the differential amplifier circuit 600. This allows achieving a much higher IIP3 (+9 dBm in the example shown later), which is what really matters when the input signal is strong. Since the input signal in this mode of operation is already strong, high gain is not needed.

MOS amplifiers suffer from higher DC offsets and 1/f noise. However, for a typical 1-MHz low-IF receiver architecture, a simple passive highpass filter following the VGA can reduce these problems. FIG. 3 includes an embodiment of such a highpass filter 900. Capacitors 910 and 920 form the filter in conjunction with resistors 912, 914, 922 and 924. Placing the MOS differential transconductor amplifier 700 after the bipolar differential amplifier 600 assures also that the MOS DC offset will not be able to saturate the VGA stage 800, since the DC offset is only amplified by the gain of the MOS amplifier 720, e.g. ~20 dB. Moreover, at the frequencies of interest in this embodiment, centered at the IF frequency (1 MHz, in our specific example), the MOS transistors are actually better than the bipolar transistors in terms of noise, since the MOS transistors have one less source of noise to worry about: i.e. they do not have a base resistance. In addition to suppressing the DC offsets and the low-frequency 1/f noise due mainly to the MOS differential transconductor 700, the highpass filter 900 serves another useful task: the common mode output voltage of the core VGA 800 (without the highpass filter 900) varies widely as a function of the differential control voltage v(vcp)−v(vcn) that controls the gain of the VGA 800. This may pose a challenge for the circuit following the VGA 800, usually an image-reject or lowpass filter, since its amplifiers would need to function properly for a wide range of input common mode voltages. The highpass filter 900 decouples the common mode output voltage of the core VGA 800 and sets a constant appropriate value $$V\_common\_mode=0.5*[v(op)+v(on)]$$

for the next stage, determined by the relative values of the resistors 912, 914, 922, and 924 in FIG. 3.

The MOS differential pair (transistors 710 and 712) in the differential transconductor circuit 700, as well as some of the MOS switches (510, 520, 522, 514, 524 and 528) in the input control circuit 500, use native low-threshold p-channel MOS transistors. These transistors are usually available in present day complementary MOS (CMOS) and bipolar CMOS (BICMOS) processes. Native MOS transistors are not used in digital circuits since they typically lead to large leakage currents when the logic gates are supposedly "off". However, their use in the VGA embodiment described here is safe and is preferable for low voltage supply operation.

Finally, in a wireless transceiver, it is desirable to be able to power the circuit down when it is not in use. The core of the VGA circuit 800 can be powered down by controlling the current source transistors 620 and 720. The highpass filter 900 could lead to a small constant DC current unless the path from the power supply to ground through resistor pairs 912 and 914 and 922 and 924 is closed when the transceiver is powered down. This is the function accomplished by the digital control voltage PDB and the CMOS transistor switches 916 and 926. In power down mode, PDB is set to PDB='0', switching off the transistors 916 and 926, so that no current flows from the supply voltage to ground through the resistors.

FIGS. 4–10 illustrate the simulated performance of the embodiment of FIG. 3. A prototype VGA was designed at the transistor level and simulated in the simulator program SPICE using an ELDO simulator. The technology used was 0.6 um BICMOS. A 2.2 volt DC power supply was used in the simulations and the resulting total current dissipation was 1.2 mA.

Figure 4:
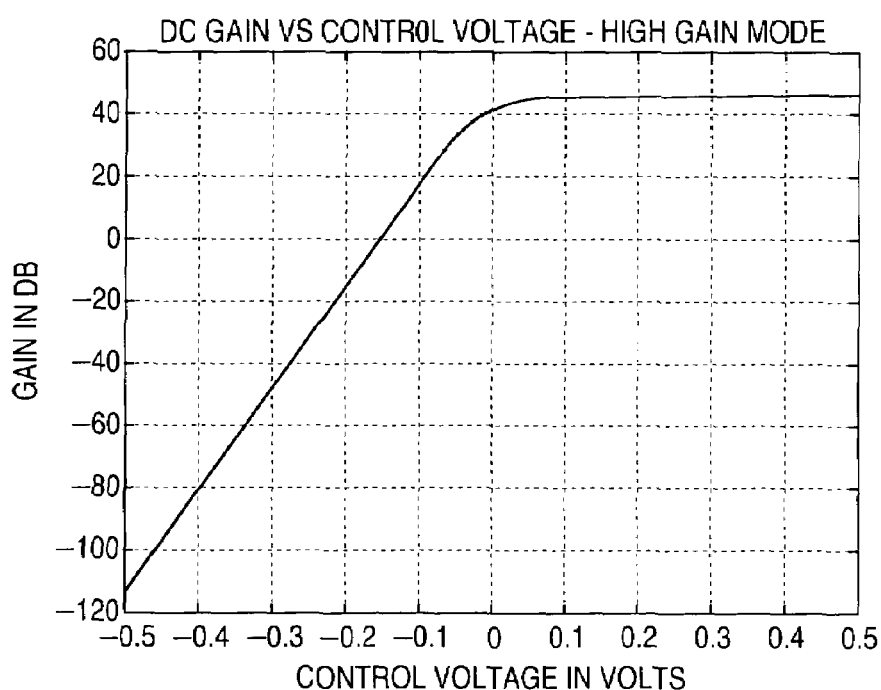
FIG. 4 is a graph illustrating the simulated DC gain vs. Control Voltage response of the circuit of FIG. 3 in high gain mode.
Figure 5:
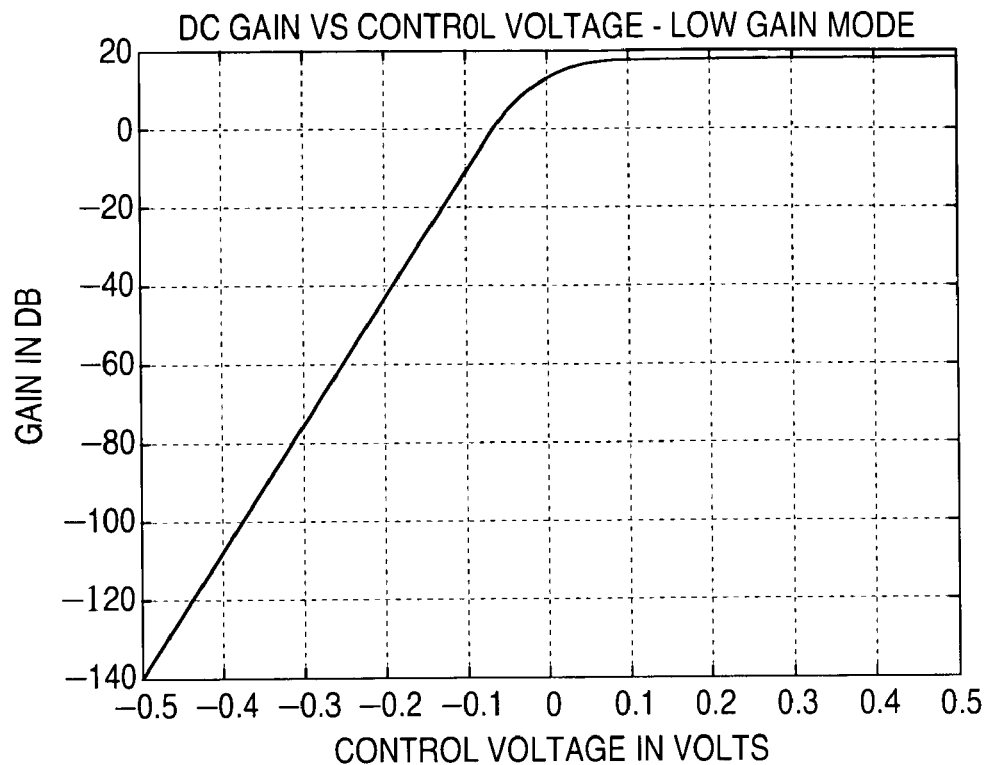
FIG. 5 is a graph illustrating the simulated DC gain vs. Control Voltage response of the circuit of FIG. 3 in low gain mode.

FIGS. 4 and 5 show the SPICE simulation results for the DC gain of the VGA versus the differential control voltage v(vcp)–v(vcn). FIG. 4 illustrates the High-Gain mode case and shows the input to output DC gain versus the differential control voltage of the VGA in high-gain-mode (HG="1", LG="0") of the circuit of FIG. 3. FIG. 5 illustrates the Low-Gain mode case and shows the input to output DC gain versus the differential control voltage of the VGA in low-gain-mode (HG="0", LG="1") of the circuit of FIG. 3. In both cases a DC input signal of 100 uV was connected to the input of the VGA, the differential output voltage v(op)–v(on) was measured as a function of the automatic gain control (AGC) voltage and the gain of the VGA was calculated and plotted. As shown in the simulation results, for negative control voltages the gain in decibels (dB) is linearly dependent upon the control voltage. Such linear dependency is highly desirable for most automatic gain control applications.

Figure 6:
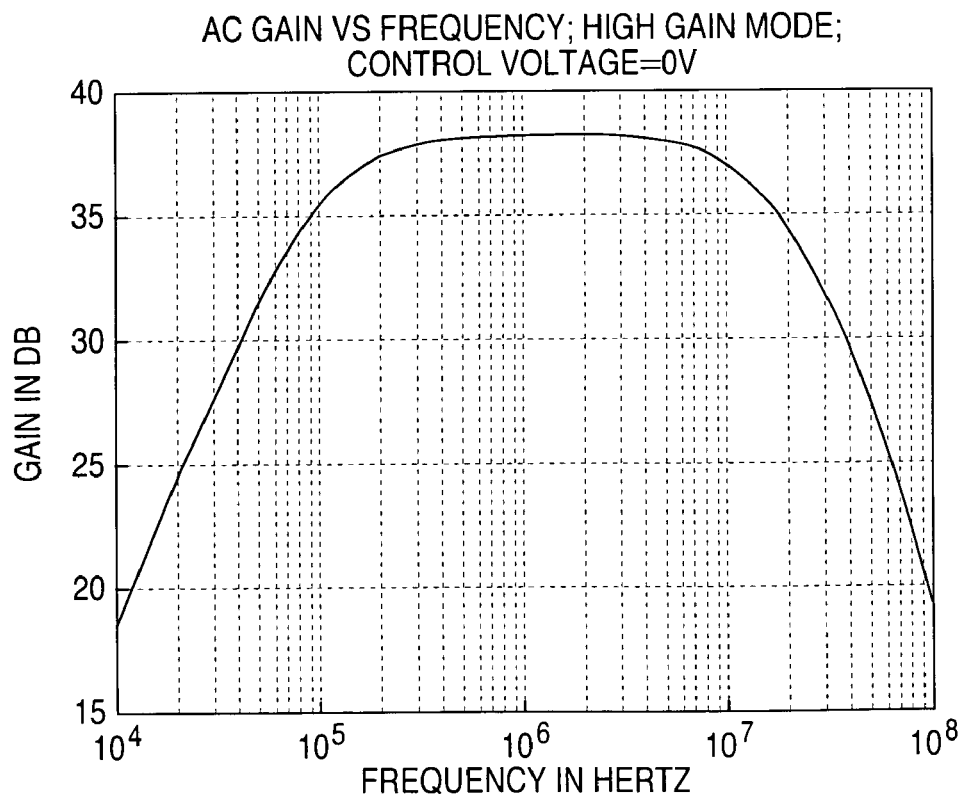
FIG. 6 is a graph showing the simulated AC gain versus Frequency response of the circuit of FIG. 3 in high gain mode.
Figure 7:
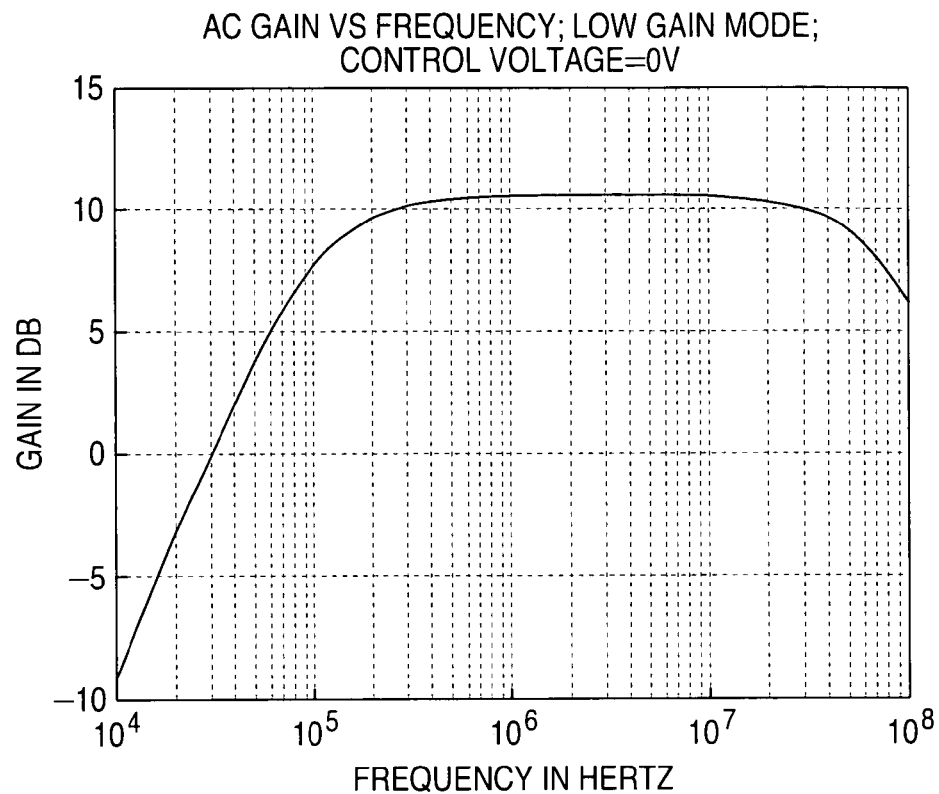
FIG. 7 is a graph showing the simulated AC gain versus Frequency response of the circuit of FIG. 3 in low gain mode.

FIGS. 6 and 7 show the SPICE simulation results for the small signal AC gain versus frequency. FIG. 6 corresponds to the High-Gain mode case whereas FIG. 7 corresponds to the Low-Gain mode case. FIG. 6 shows the AC gain versus frequency response of the circuit of FIG. 3, where the control voltage is set to 0, e.g. V(VCP)–V(VCN)=0 in high gain mode (HG="1", LG="0"). In both cases the control voltage that controls the gain of the VGA was set to Vc=0 Volts. FIG. 6 shows that the small signal gain curve has a plateau centered at approximately 1 MHz, with the gain at the plateau being about 38 dB. This is consistent with the results for the DC gain versus the control voltage Vc, as shown in FIG. 4, that shows the DC gain is about 40 dB at Vc=0.

FIG. 6 also shows that the gain is attenuated both at low and high frequencies. The attenuation of the gain at low frequencies (below 100 KHz) is the result of the highpass filter 900 in the last stage of the VGA. The attenuation of the gain at high frequencies (above 10 MHz) is the result of the effective lowpass filter action due to the combination of the resistors 602 and 604 with the input capacitance of the MOS transconductor amplifier circuit 700, due mainly to the gate capacitance of transistors 710 and 712. This bandpass characteristic of the VGA is an additional bonus of this architecture since we are primarily interested in amplifying only the desired signal. In a 1-MHz low-IF architecture receiver, the desired signal is centered at 1 MHz. The bandpass characteristics of the VGA help get rid of unwanted out-of-band interferers.

FIG. 7 shows the AC gain versus frequency response of the circuit of FIG. 3 for the low-gain mode (HG="0", LG="1"), where the control voltage is set to 0, e.g. V(VCP)–V(VCN)=0. The small signal gain curve has a plateau centered around 3 MHz. The gain at the plateau is about 10 dB, consistent with the results shown in FIG. 5 for the DC gain versus control voltage at Vc=0 Volt. The low-frequency cutoff of the gain curve is again around 100 KHz due to the highpass filter 900 in the last stage of the VGA. However, the gain at high frequencies begins to fall at higher frequencies around 50 MHz. The reason is that in the low-gain mode the resistors 602 and 604 are disconnected from the input of the MOS amplifier 700 by the MOS transistor switches 522 and 526 that are "off". However, the switches 520 and 524 that connect the inputs of the VGA, INP and INN, to the inputs of the MOS amplifier INP2 and INN2, respectively, have themselves a small 'on' resistance of about 1 Kohm. This 'on' resistance, together with the input capacitance of the MOS amplifier 700, creates a higher frequency pole around 50 MHz that gives rise to the slope of the gain versus frequency curve at high frequencies. If desired, resistors similar to 600 and 604 can be added in series to these switches to keep the bandwidth of the VGA the same, both in the high-gain and in the low-gain modes.

Figure 8A:
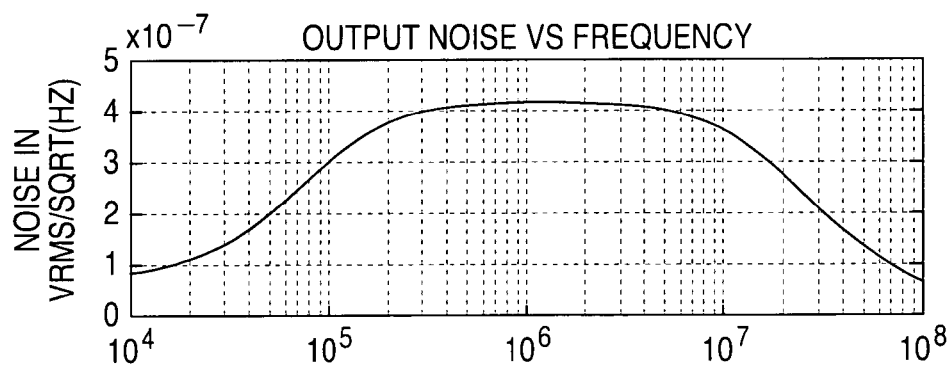
FIG. 8A is a graph showing the simulated output noise versus frequency response of the circuit of FIG. 3 in high gain mode.
Figure 8B:
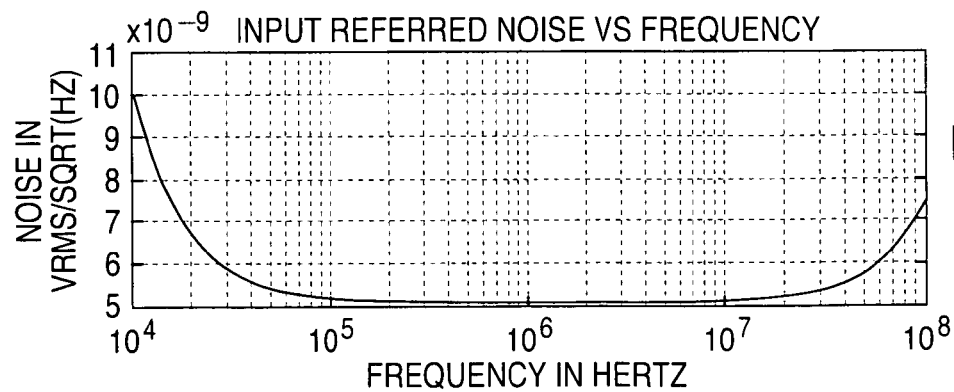
FIG. 8B is a graph showing the simulated Input Referred Noise versus Frequency response of the circuit of FIG. 3 in high gain mode.

FIGS. 8A and 8B give the ELDO simulation results for the noise generated by the circuit elements versus frequency in the high-gain mode. FIG. 8 illustrates the output noise and input referred noice of the VGA in Vrms/sqrrt(Hz), when the gain control voltage is set to 0 in high gain mode. The AGC control voltage was set to Vc=0 Volts (corresponding to a gain of ~40 dB in the passband). The output noise is about 0.42 uVrms/sqrt(Hz) and the input referred noise is about 5.1 nVrms/sqrt(Hz). For a bandwidth BW of about 1.2 MHz around the center frequency of 1 MHz (corresponding to the signal bandwidth as well as the receiver bandwidth defined by the filters following the VGA), this corresponds to 0.42e-6*sqrt(1.2e+6)~460 uVrms total output noise and, similarly, to 5.7 uVrms total input referred noise. For example, assuming a clean input signal to the VGA of 100 uVrms (noiseless signal) at 1 MHz, this corresponds to a Signal-to-Noise-Ratio, SNR of ~25 dB.

Figure 9:
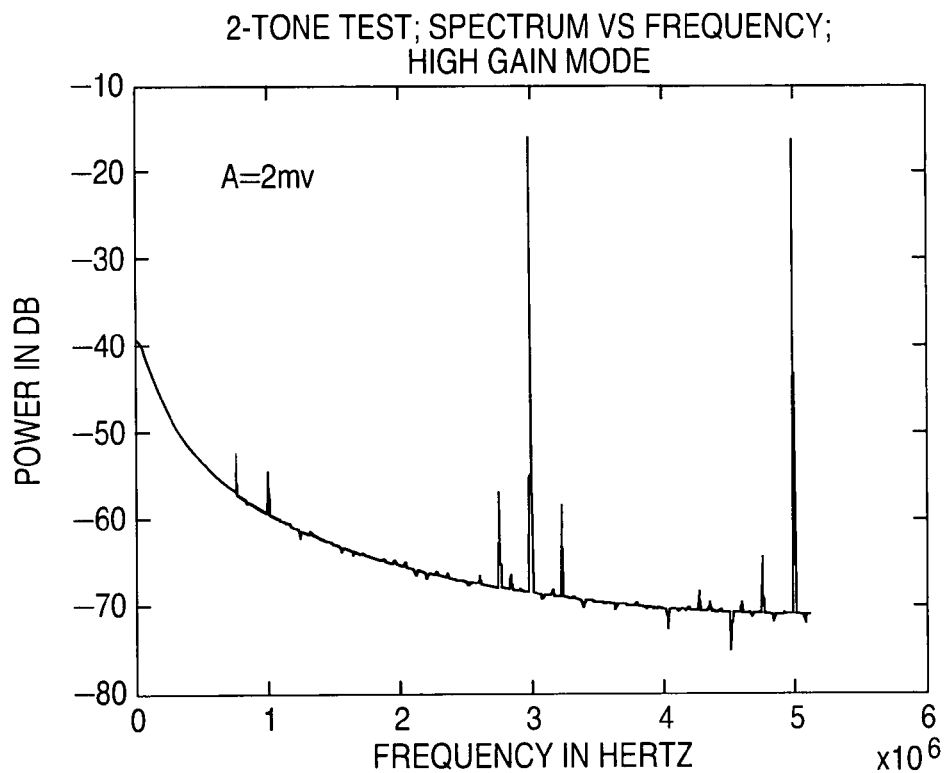
FIG. 9 is a graph showing a simulated 2-tone test; Spectrum vs. Frequency response of the circuit of FIG. 3 in high gain mode.
Figure 10:
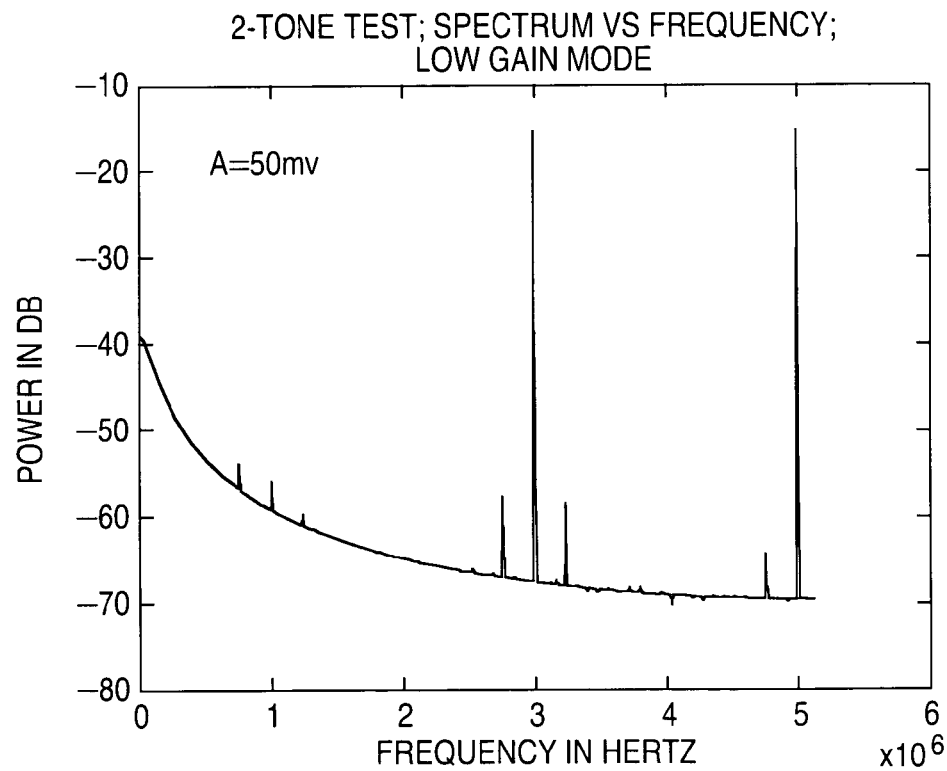
FIG. 10 is a graph showing the simulated 2-tone test; Spectrum vs. Frequency response of the circuit of FIG. 3 in low gain mode.

FIGS. 9 and 10 show the results of a two tone intermodulation simulation. In this case the input to the VGA is a two-tone signal with input tones at 3 MHz and 5 MHz, the intermodulation product at 1 MHz, and the amplitude of the input tones is 2 mV. FIG. 9 illustrates the high gain mode and FIG. 10 illustrates the low gain mode. The tones are centered at the adjacent and alternate adjacent channels. The channels in this application are separated from each other by 2 MHz.

$$Vin(t)=A*\text{cosinus}(3\text{ MHz})+A*\text{cosinus}(5\text{ MHz})$$

In an intermodulation test, the amplitude A of the interferer channels at 3 and 5 MHz is increased until the tone at 1 MHz, generated by the non-linearities in the VGA, emerges above the background of the frequency spectrum (calculated from the output waveform using a Fast Fourier Transform). In the high-gain mode, FIG. 9, A=2 mV and in the low-gain mode, FIG. 10, A=50 mV.

A simple calculation gives the following results for the IIP3:

High-gain mode (weak signals): IIP3~–20 dBm
Low-gain mode (strong signals): IIP3~+9 dBm Having illustrated and described the principles of the present invention in the context of the embodiments described above, it should be readily apparent to those skilled in the art that the invention can be modified in arrangement and detail without departing from such principles. For example, alternative implementations of the functional blocks of FIG. 2 may be suitable for use with the present invention.

I claim:

1. A low-voltage supply low-power variable gain amplifier circuit, the circuit comprising:
   a first amplifier having an input and an output;
   a transconductor having an input and an output;
   a variable gain amplifier having an input coupled to the output of the transconductor, an output and a variable gain control input, where the variable gain amplifier is configured such that a gain of the variable gain amplifier is controlled by a signal received at the variable gain control input; and
   an input control circuit having a first input for receiving a signal to be amplified, a second input electrically coupled to the output of the first amplifier, a first output coupled to the input of the first amplifier, a second output coupled to the input of the transconductor, and a gain control input, where the input control circuit is configured to electrically coupled the first input and first output terminals of the input control circuit responsive to a first signal received at the gain control input corresponding to a high gain mode, wherein the first amplifier is engaged, and is further configured to electrically couple the second input and second output terminals of the input control circuit responsive to a second signal received at the gain control input corresponding to a low gain mode, wherein the first amplifier is disengaged.

2. The circuit of claim 1 wherein:
the first amplifier further comprises a differential amplifier;
the transconductor further comprises a differential transconductor; and
the variable gain amplifier further comprises a differential variable gain amplifier.

3. The circuit of claim 1, the circuit further including a filter circuit having an input coupled to the output of the variable gain amplifier.

4. The circuit of claim 3, where the filter circuit further comprises a high pass filter.

5. The circuit of claim 1, where:
the input control circuit is further configured to generate a disabling signal at the first output of the input control circuit responsive to the second signal received at the gain control input corresponding to a low gain mode; and
the first amplifier is further configured to reduce its power supply current draw responsive to the disabling signal output by the input control circuit.

6. A circuit for selectively providing high gain amplification and low gain amplification to a received signal, the circuit comprising:
means for amplifying the received signal;
means for transconducting the received signal;
means for variably amplifying the transconducted received signal under control of a variable gain control signal; and
input control means for selectively engaging the amplifying means to amplify the received signal and output the amplified received signal to the transconducting means responsive to a high gain signal and disengaging the amplifying means and routing the received signal to the transconducting means responsive to a low gain signal.

7. The circuit of claim 6, wherein:
the means for amplifying the received signal further comprises means for differentially amplifying the received signal;
the means for transconducting the received signal further comprises means for differentially transconducting the received signal; and
the means for variably amplifying the transconducted received signal under control of a variable gain control signal further comprises means for differentially variably amplifying the transconducted received signal under control of a variable gain control signal.

8. The circuit of claim 6, the circuit further including means for filtering the variably amplified received signal.

9. The circuit of claim 8, where the means for filtering the variably amplified received signal further comprises means for high pass filtering the variably amplified received signal.

10. The circuit of claim 6, wherein:
the input control means is further configured to provide a disabling signal to the amplifying means responsive to the low gain signal; and
the amplifying means is further configured to reduce its power consumption responsive to the disabling signal.

11. A method for selectively providing high gain amplification and low gain amplification to a received signal, the method comprising the steps of:
providing an amplification stage for amplifying the received signal;
providing a transconductance stage for transconducting the received signal;
providing a variable gain stage for amplifying the output of the transconductance stage under control of a variable gain control signal;
selectively engaging the amplification stage to amplify the received signal and output the amplified received signal to the transconductance stage responsive to a control signal corresponding to a high gain mode; and
selectively routing the received signal to the transconductance stage responsive to a control signal corresponding to a low gain mode.

12. The method of claim 11, wherein:
the step of providing an amplification stage for amplifying the received signal further comprises providing a differential amplification stage for differentially amplifying the received signal;
the step of providing a transconductance stage for transconducting the received signal further comprises providing a differential transconductance stage for differentially transconducting the received signal;
the step of providing a variable gain stage for amplifying the output of the transconductance stage under control of a variable gain control signal further comprises providing a differential variable gain stage for differentially amplifying the output of the transconductance stage under control of a variable gain control signal.

13. The method of claim 11, the method further including the step of filtering the output of the variable gain stage.

14. The method of claim 13, where the step of filtering the output of the variable gain stage further comprises high pass filtering the output of the variable gain stage.

15. The method of claim 11, where the step of selectively routing the received signal to the transconductance stage responsive to a control signal corresponding to a low gain mode further includes disabling the amplifier stage in the low gain mode.

* * * * *